(12) United States Patent
Yin et al.

(10) Patent No.: US 12,310,173 B2
(45) Date of Patent: May 20, 2025

(54) COMPOSITE FUNCTIONAL FILM, MANUFACTURING METHOD FOR SAME, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Hang Yin, Hubei (CN); Yilin Fu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/756,637

(22) PCT Filed: Apr. 28, 2022

(86) PCT No.: PCT/CN2022/089915
§ 371 (c)(1),
(2) Date: May 28, 2022

(87) PCT Pub. No.: WO2023/197380
PCT Pub. Date: Oct. 19, 2023

(65) Prior Publication Data
US 2024/0164139 A1 May 16, 2024

(30) Foreign Application Priority Data
Apr. 12, 2022 (CN) .......................... 202210382331.0

(51) Int. Cl.
*H10K 59/12* (2023.01)
*C09J 7/40* (2018.01)
(Continued)

(52) U.S. Cl.
CPC .......... *H10K 59/1201* (2023.02); *C09J 7/405* (2018.01); *H10K 59/873* (2023.02);
(Continued)

(58) Field of Classification Search
None
See application file for complete search history.

(56) References Cited

U.S. PATENT DOCUMENTS

2016/0072094 A1 3/2016 Kim
2020/0068725 A1 2/2020 Park et al.
(Continued)

FOREIGN PATENT DOCUMENTS

CN 108582939 A 9/2018
CN 110283551 A 9/2019
(Continued)

OTHER PUBLICATIONS

International Search Report in International application No. PCT/CN2022/089915, mailed on Dec. 15, 2022.
(Continued)

*Primary Examiner* — Cory W Eskridge
(74) *Attorney, Agent, or Firm* — PV IP PC; Wei Te Chung

(57) ABSTRACT

A composite functional film, a manufacturing method for same, and a display device are provided by the present application. The composite functional film includes a heat dissipation layer including a first part and a second part arranged around an outside of the first part; a buffer layer disposed on a side of the heat dissipation layer and disposed corresponding to the first part; a supporting layer disposed on the side of the heat dissipation layer and disposed corresponding to the second part; and the buffer layer and the supporting layer are disposed on a same side of the heat
(Continued)

dissipation layer, and an elastic modulus of the supporting layer is greater than an elastic modulus of the buffer layer.

20 Claims, 10 Drawing Sheets

(51) Int. Cl.
  *H10K 59/80* (2023.01)
  *H10K 102/00* (2023.01)
(52) U.S. Cl.
  CPC ... *H10K 59/8794* (2023.02); *H10K 2102/351* (2023.02); *H10K 2102/361* (2023.02)

(56) References Cited

U.S. PATENT DOCUMENTS

| | | | | |
|---|---|---|---|---|
| 2021/0257582 A1* | 8/2021 | Kim | ............ | C09D 5/16 |
| 2022/0129040 A1* | 4/2022 | Kim | ............ | H04M 1/0268 |
| 2022/0320397 A1* | 10/2022 | Lee | ............ | H10H 20/8506 |

FOREIGN PATENT DOCUMENTS

| | | | | |
|---|---|---|---|---|
| CN | 110853506 A | * | 2/2020 | ............ G06F 1/1641 |
| CN | 211339379 U | | 8/2020 | |
| CN | 111867342 A | | 10/2020 | |
| CN | 113022046 A | | 6/2021 | |
| CN | 113066369 A | | 7/2021 | |
| CN | 213803605 U | | 7/2021 | |
| CN | 113539097 A | | 10/2021 | |
| CN | 113593412 A | | 11/2021 | |
| CN | 113613461 A | | 11/2021 | |
| CN | 113764356 A | | 12/2021 | |
| CN | 114049846 A | | 2/2022 | |
| CN | 116782698 A | * | 9/2023 | |

OTHER PUBLICATIONS

Written Opinion of the International Search Authority in International application No. PCT/CN2022/089915,mailed on Dec. 15, 2022.
Chinese Office Action issued in corresponding Chinese Patent Application No. 202210382331.0 dated Apr. 19, 2023, pp. 1-8.

* cited by examiner

COMPOSITE FUNCTIONAL FILM, MANUFACTURING METHOD FOR SAME, AND DISPLAY DEVICE

TECHNICAL FIELD

The present application relates to the field of display technologies, and particularly to a composite functional film, a manufacturing method for same, and a display device adopting the composite functional film.

BACKGROUND

Among materials of elements stacked in modules of organic light-emitting diode (OLED) screens, a composite functional film is a multi-layered material capable of functioning as a buffer layer and a heat conductive layer, and the like, the composite functional film is able to protect the screens from damages to a certain extent. The composite functional film is an important material to ensure stability of the screens under severe environmental conditions.

At present, the composite functional film used in the industry includes copper foil with heat dissipation functions and foam materials with buffer functions. A die-cutting using a cutting die of a round blade or a flat blade is used as a manufacturing process of the composite functional film; however, the buffer layer is softer and unable to provide sufficient support, which gives a chance that the copper foil curls in a cutting process of the composite functional film. When negative phenomena of curling of the composite functional film occur, the curling copper foil creates a shadow on an image taken by charge-coupled device (CCD) cameras, and identification errors of automatic optic inspection (AOI) devices are increased, resulting in an increase in bonding tolerance of the composite functional film and a decreasing in yield, leading to poor bonding, and affecting displaying performance of display devices. This problem needs to be solved urgently.

SUMMARY OF INVENTION

The present application provides a composite functional film, a manufacturing method for same, and a display device, being able to reduce a probability of curling during a die-cutting process of a heat dissipation layer using knives, increasing identification accuracy of AOI devices and increasing a bonding yield between the composite functional film and the display panel to ensure display quality of the display device. The present application provides a composite functional film, including:
  a heat dissipation layer comprising a first part and a second part, wherein the second part is arranged around an outside of the first part;
  a buffer layer disposed on a side of the heat dissipation layer, and disposed corresponding to the first part; and
  a supporting layer disposed on the side of the heat dissipation layer, and disposed corresponding to the second part;
  wherein the buffer layer and the supporting layer are located on a same side of the heat dissipation layer, and an elastic modulus of the supporting layer is greater than an elastic modulus of the buffer layer.

Optionally, a thickness of the first part is equal to a thickness of the second part, and a thickness of the supporting layer is equal to a thickness of the buffer layer.

Optionally, the heat dissipation layer further comprises a third part, and the third part is arranged around the outside of the first part, the second part is arranged around an outside of the third part, and the third part adjoins the first part and the second part, receptively; a gap region is defined between the buffer layer and the supporting layer, and the gap region corresponds to the third part, wherein the thickness of the first part, the thickness of the second part, and a thickness of the third part are equal to each other.

Optionally, a thickness of the first part is less than a thickness of the second part, and a thickness of the buffer layer is greater than a thickness of the supporting layer.

Optionally, the heat dissipation layer further comprises a third part, and the third part is arranged around the outside of the first part; the second part is arranged around an outside of the third part, and the third part adjoins the first part and the second part, receptively; a gap region is defined between the buffer layer and the supporting layer, and the gap region corresponds to the third part, wherein a thickness of the first part is equal to a thickness of the third part, or a thickness of the second part is equal to a thickness of the third part.

Optionally, a width of the gap region ranges from 0.2 millimeters to 0.5 millimeters.

Optionally, the composite functional film further comprises an adhesive layer, and the adhesive layer is disposed on a side of the buffer layer facing away from the heat dissipation layer, and an orthographic projection of the adhesive layer on the heat dissipation layer covers the first part and the second part.

In another aspect, the present application also provides a manufacturing method for the composite functional film, the manufacturing method for the composite functional film includes following steps:
  providing an adhesive layer, the adhesive layer comprising a first region and a second region arranged around an outside of the first region, and forming a buffer layer and a supporting layer on the first region and the second region, receptively; and
  forming a heat dissipation layer on the buffer layer and the supporting layer, wherein the heat dissipation layer comprises a first part and a second part, and the second part is arranged around an outside of the first part, the first part is disposed corresponding to the buffer layer, and the second part is disposed corresponding to the supporting layer.

Optionally, the adhesive layer is formed on a release film; and a protective film is disposed on a side of the heat dissipation layer facing away from the buffer layer and the supporting layer.

In still another aspect, the present application also provides a display device, including a display panel, a cover glass, and a composite functional film, wherein the display panel has a light-emitting side and a backlight side, the composite functional film is disposed on the backlight side of the display panel, the cover glass is disposed on the light-emitting side of the display panel.

The present application provides a composite functional film, a manufacturing method for same, and a display device. In the present application, the supporting layer with a greater elastic modulus is disposed corresponding to the second part of the heat dissipation layer, so as to improve support strength of edge region of the heat dissipation layer in the composite functional film, and reduce the probability of curling during die-cutting of heat dissipation layer using cutting die, thus ensuring identification accuracy of the AOI device, increasing bonding yield between the composite functional film and the display panel, and ensuring display quality.

BRIEF DESCRIPTION OF DRAWINGS

In order to more clearly illustrate the technical solution of embodiments of this application, a brief description of drawings that are necessary for the illustration of the embodiments of this application will be given as follows. Obviously, the drawings described below show only some embodiments of this disclosure, and a person having ordinary skill in the art may also obtain other drawings based on the drawings described without making any creative effort.

DETAILED DESCRIPTION OF PREFERRED EMBODIMENTS

Figure 1:
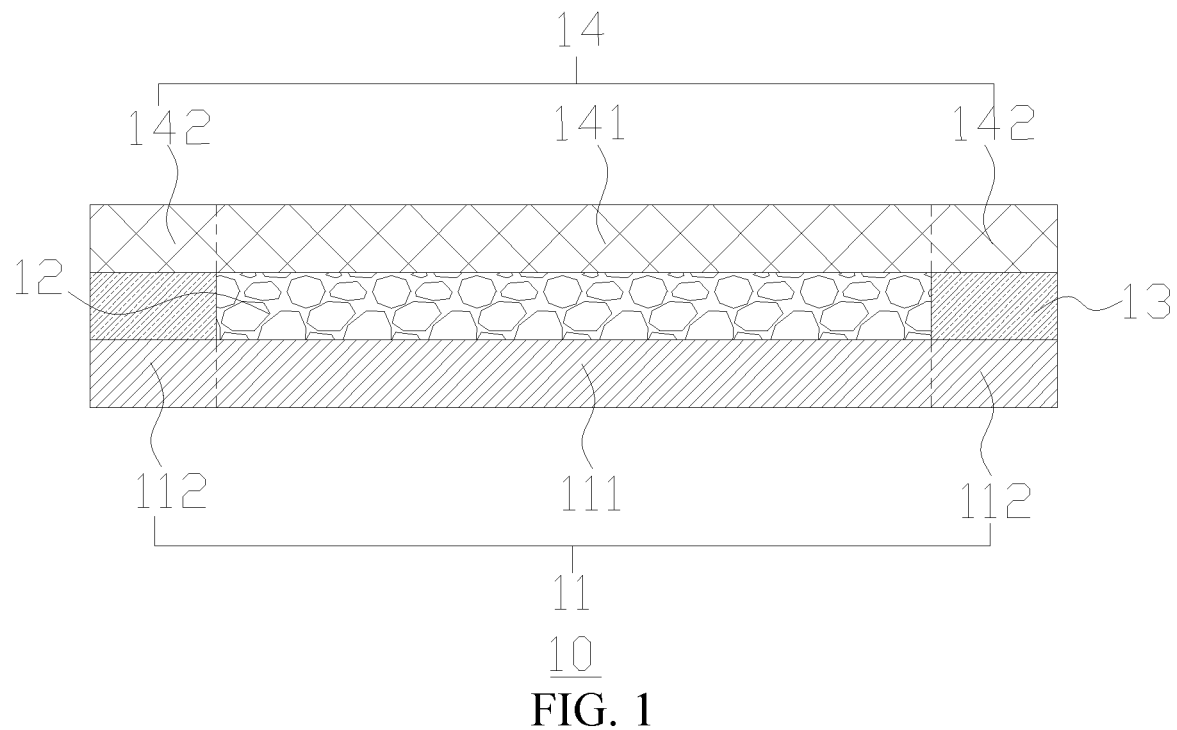
FIG. 1 is a structural schematic view of a composite functional film under a state provided by an embodiment 1 of the present application.

The technical schemes of this application will be described clearly and completely below in combination with the drawings in the embodiments of this application. Obviously, the described embodiments are only part of the embodiments of this application, not all of them. A person having ordinary skill in the art may obtain other embodiments based on the embodiments provided in this application without making any creative effort, which all belong to the scope of the present disclosure. Moreover, it should be noted that the specific embodiments described herein are provided to illustrate and explain the present application, and are not intended to limit the present application. In the present application, in the absence of a contrary explanation, the nouns of locality such as "on" and "under", usually refer to "on" and "under" in the device in actual use or under a working state, specifically refers to a drawing direction in the drawings; and the nouns of locality "in" and "out" are based on a contour of the device.

The following disclosure provides many different embodiments or examples to implement different structures of the present application. In order to simplify the disclosure of the present application, the components and configurations of specific examples are described below. Certainly, they are merely examples and are not intended to limit the present application. Moreover, the present application may repeat reference numbers and/or reference letters in different examples for the purpose of simplification and clarity, which does not indicate a relationship between various embodiments and/or configurations discussed itself. In addition, the present application provides examples of various specific processes and materials, but those skilled in the art can be aware of the application of other processes and/or other materials. Following is detailed descriptions, it should be noted that the order of description of the following embodiments cannot be regarded as the limitation to the preferred order of the embodiments.

In manufacturing processes of the composite functional films of prior arts, die-cutting using cutting dies, such as a flat blade or a round blade, to cut the composite functional films is necessary for the preparation of composite functional films having size matching the display panels. A cutting direction of knives points to a buffer layer from a heat dissipation layer, and the heat dissipation layer is usually defined as a relatively thin metal layer; the buffer layer is softer and unable to provide sufficient support, which gives a chance that the heat dissipation layer curls. The curling heat dissipation layer creates a shadow on an image taken by a CCD camera, and identification errors of automatic optic inspection (AOI) devices are increased, resulting in an increase in bonding tolerance of the composite functional film, and it is easy to induce poor bonding between the composite functional films and the display panels, and a decreasing in yield.

A composite functional film, a manufacturing method for same, and a display device are provided by the present application, which greatly reduces probability of the curling of the heat dissipation layer in the composite functional film, ensures identification accuracy of AOI devices, and increases a bonding yield between the composite functional films and display panels to ensure display quality of the display device.

Embodiment 1

FIG. 1 is a structural schematic view of a composite functional film under a state provided by an embodiment 1 of the present application. As shown in FIG. 1, the present application provides a composite functional film 10, and the composite functional film 10 has functions of both heat dissipation and buffering. Specifically, the composite functional film 10 includes a heat dissipation layer 11, a buffer layer 12, and a supporting layer 13. Wherein the heat dissipation layer 11 includes a first part 111 and a second part 112 arranged around an outside of the first part 111; a buffer layer 12 disposed on a side of the heat dissipation layer 11 and disposed corresponding to the first part 111; a supporting layer 13 disposed on the side of the heat dissipation layer 11 and disposed corresponding to the second part 112; wherein the buffer layer 12 and the supporting layer 13 are disposed on a same side of the heat dissipation layer 11, and an elastic modulus of the supporting layer 13 is greater than an elastic modulus of the buffer layer 12.

In this embodiment, an orthographic projection of a cutting line of the composite functional film 10 on the heat dissipation layer 11 is located within a region where the second part 112 is positioned; on another hand, the second part 112 corresponds to the supporting layer 13, and the elastic modulus of the supporting layer 13 is greater than the elastic modulus of the buffer layer 12; that is to say, a hardness of the supporting layer 13 is greater than a hardness of the buffer layer 12. Therefore, the supporting layer 13 is able to provide great support for the heat dissipation layer 11 during a die-cutting process, so as to greatly reduce probability of curling of the heat dissipation layer 11, which ensures identification accuracy of optic inspection devices, and improves a yield of subsequent bonding of the composite functional film 10 and the display panel 20. Besides, the supporting layer 13 is in a square shape, and the supporting layer 13 covers a whole edge region of the composite functional film 10. Compared to that only part of the edge region of the composite functional film 10 is provided with a supporting structure, the composite functional film 10 provided by the present application can not only increase detection accuracy and lower detection errors, but also increase grabbing recognition accuracy during a grabbing process of the composite functional film 10 by a grabbing device.

In this embodiment, a material of the heat dissipation layer 11 is a metal with great heat dissipation performance. An exemplary material of the heat dissipation layer 11 includes at least one of copper, aluminum, and copper alloys. Preferably, the heat dissipation layer 11 is defined as a copper foil made of copper alloy. The copper alloy is defined as copper doped with at least one of a carbon element, a silicon element, and a nickel element. It can be understood for those skilled in the art that doping of the carbon element, the silicon element, and the nickel element into copper can be performed by conventional means in the art, and there is no restriction on a mass ratio of the carbon element, the silicon element, and the nickel element in the copper alloy.

In this embodiment, a material of the buffer layer 12 includes a foam, for example, a super clean foam (SCF, for short), the foam is a buffer to external force, and can prevent the display panel from damage caused by bonding pressure during a bonding process of the composite functional film 10 and the display panel.

In this embodiment, a material of the supporting layer 13 includes at least one of polyethylene terephthalate (PET), acrylonitrile butadiene styrene copolymer (ABS), polyimide (PI), polyethylene (PE), polymethyl methacrylate (PMMA), polycarbonate (PC), and polypropylene (PP), but is not limited thereto. Such materials can provide sufficient support to the heat dissipation layer 11, and efficiently solve the problem of the curling of the heat dissipation layer 11 during the die-cutting process. Preferably, a material of the supporting layer 13 is defined as PET. PET is a regular material in flexible OLED display panels with a great elastic modulus, good stiffness, and low cost.

In this embodiment, the heat dissipation layer 11 directly contacts the buffer layer 12 and the supporting layer 13, that is to say, there are no other layers between the heat dissipation layer 11 and the buffer layer 12, and no other layers between the heat dissipation layer 11 and the supporting layer 13. Therefore, an overall thickness of the composite functional film 10 can be reduced as much as possible, and bending performance of the composite functional film 10 can be improved.

In this embodiment, the first part 111 of the heat dissipation layer 11 adjoins the second part 112 of the heat dissipation layer 11, and the first part 111 corresponds to a central region of the heat dissipation layer 11, and the second part 112 corresponds to an edge region of the heat dissipation layer 11. Wherein a thickness of the first part 111 is equal to a thickness of the second part 112, and a thickness of the supporting layer 13 is equal to a thickness of the buffer layer 12. As the thickness of the first part 111 is equal to the thickness of the second part 112, and the thickness of the supporting layer 13 is equal to the thickness of the buffer layer 12, a surface of the supporting layer 13 facing away from the heat dissipation layer 11 is flush with a surface of the buffer layer 12 facing away from the heat dissipation layer 11; it is possible to lower a risk of curling without increasing a thickness of the composite functional film 10, and to ensure smoothness of film layers arranged on a surface of the supporting layer 13 facing away from the heat dissipation layer 11 and a surface of the buffer layer 12 facing away from the heat dissipation layer 11.

In this embodiment, wherein the composite functional film 10 further includes an adhesive layer 14, and the adhesive layer 14 is disposed on a side of the buffer layer 12 facing away from the heat dissipation layer 11, and an orthographic projection of the adhesive layer 14 on the heat dissipation layer 11 covers the first part 111 and the second part 112. For example, the adhesive layer 14 is a grid adhesive. A material of the adhesive layer 14 includes acrylic adhesive and silica gel. The grid adhesive can be made by imprinting an adhesive surface with vertical and horizontal reticulation under pressure using a grid, so as to avoid curling phenomena caused by shrinkage of the adhesive layer 14 and strengthen tightness of bonding of the composite functional film 10 and display panel 20.

In this embodiment, the adhesive layer 14 includes a first region 141 and a second region 142, the second region 142 is arranged around an outside of the first region 141, the first region 141 corresponds to the first part 111, and the second region 142 corresponds to the second part 112.

In this embodiment, the composite functional film 10 can be directly bonded to the display panel 20 through the adhesive layer 14, and FIG. 1 shows a state of the composite functional film 10 being bonded to the display panel 20.

Figure 2:
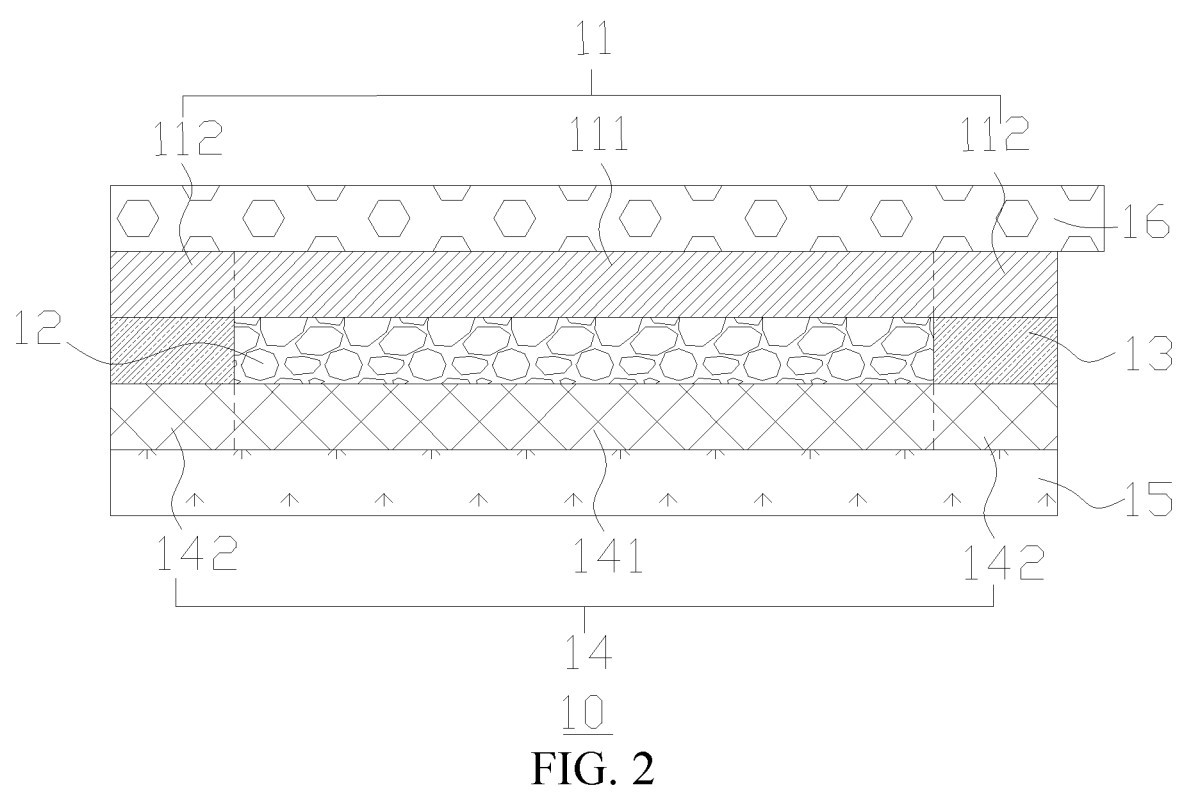
FIG. 2 is a structural schematic view of the composite functional film under another state provided by the embodiment 1 of the present application.
Figure 3A:
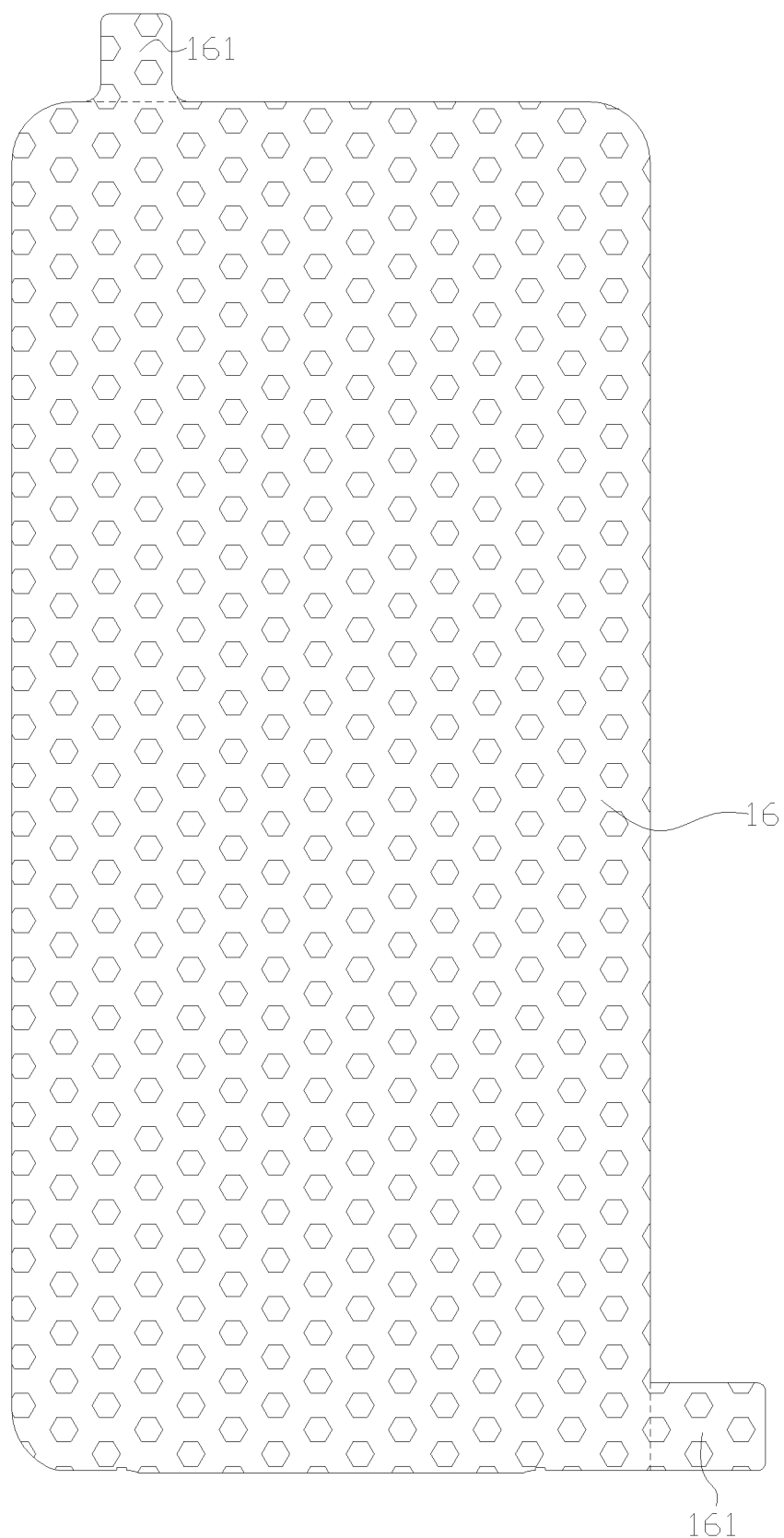
FIG. 3a to FIG. 3e are top views of each film layer in FIG. 2.
Figure 3B:
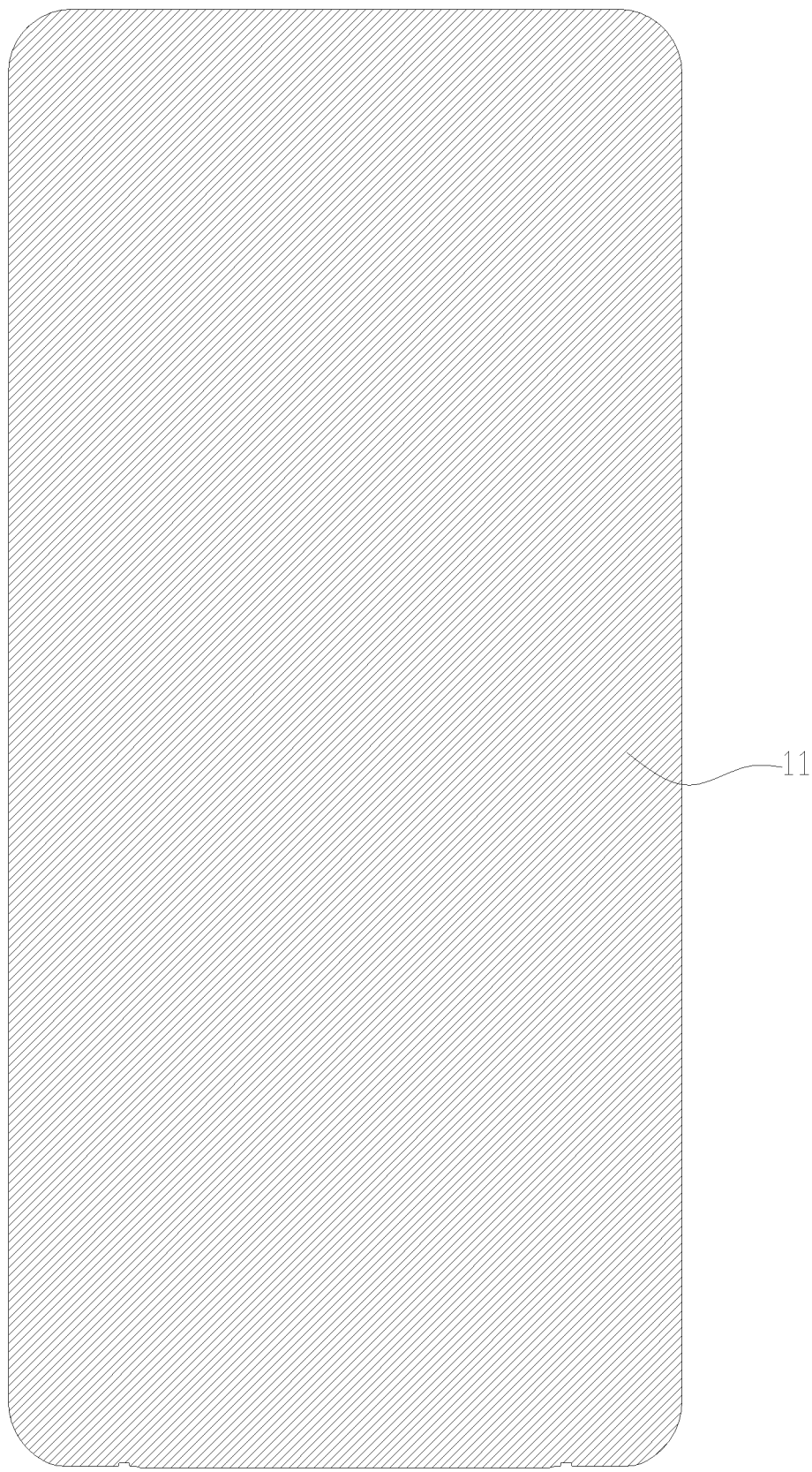
Figure 3C:
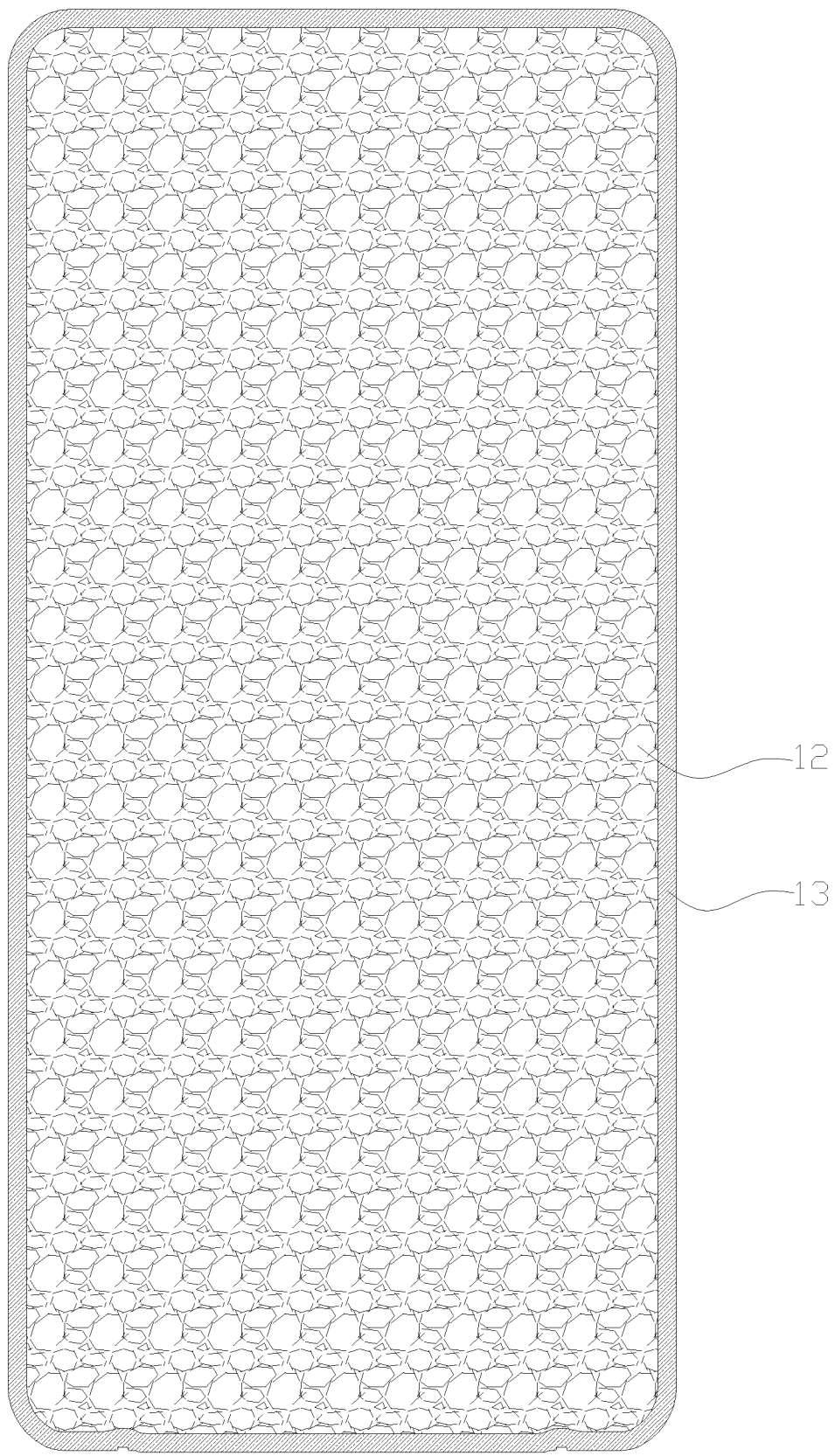
Figure 3D:
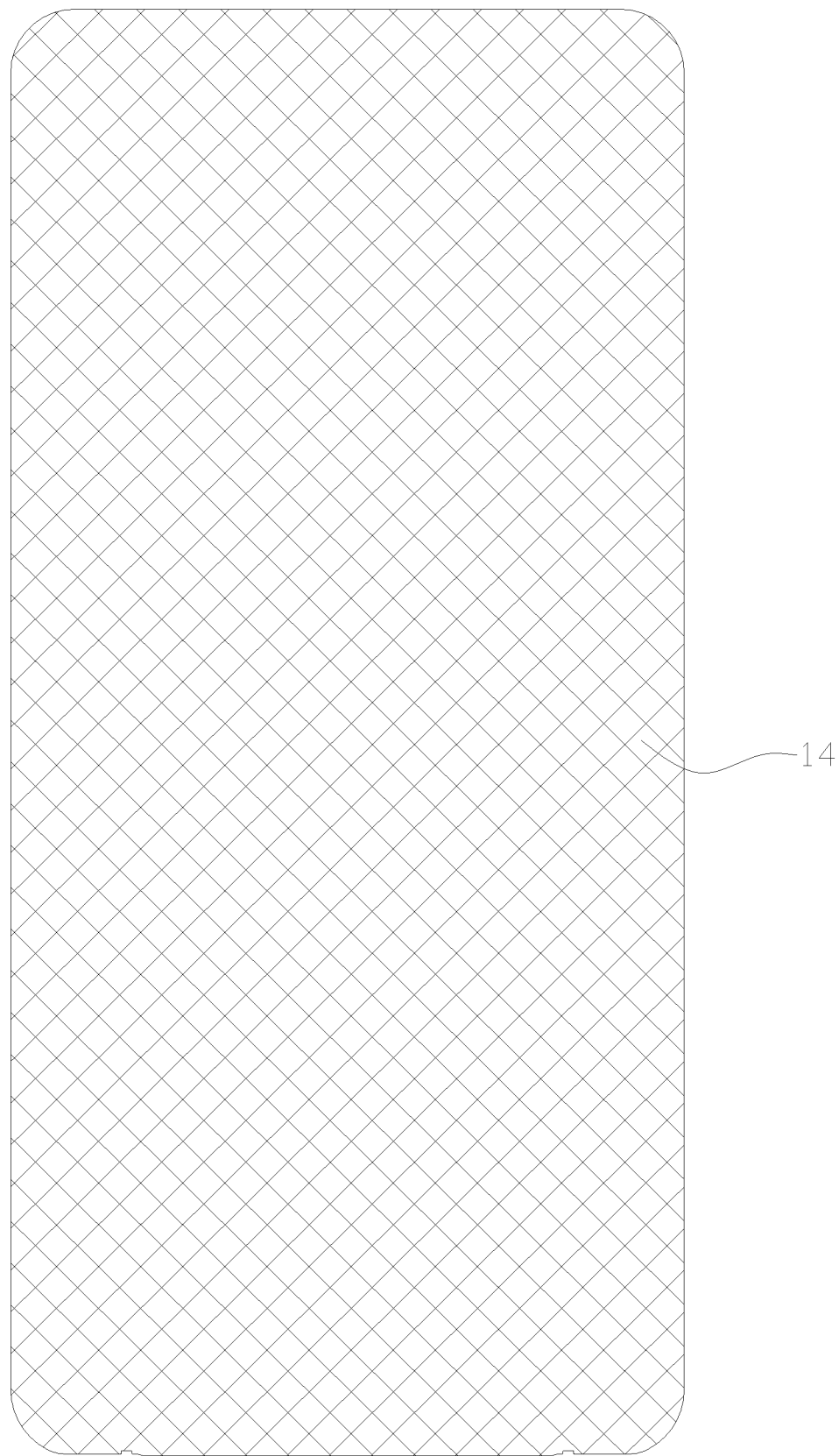
Figure 3E:
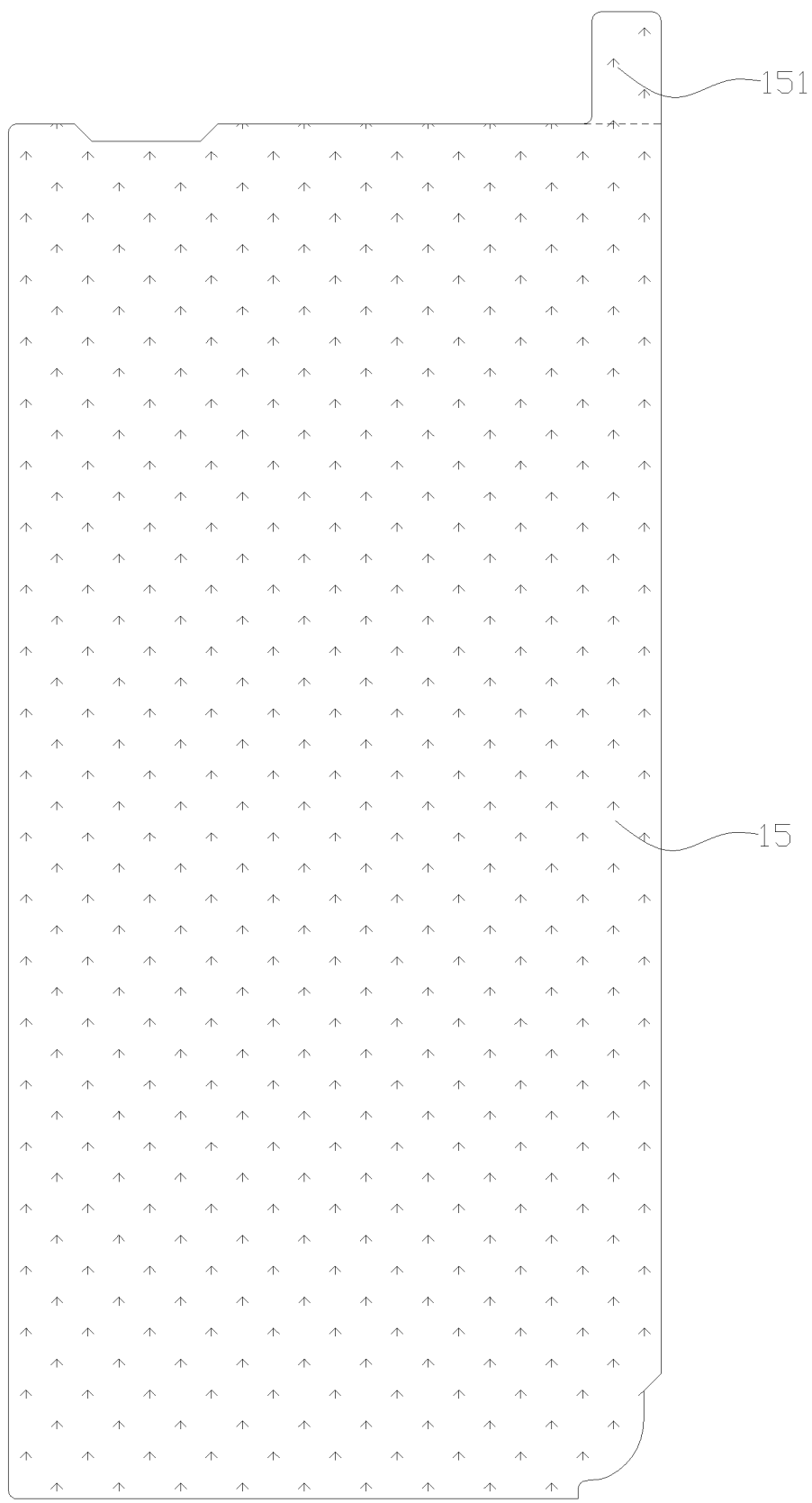

FIG. 2 is a structural schematic view of the composite functional film under another state provided by the embodiment 1 of the present application, and FIG. 3a to FIG. 3e are top views of each film layer in FIG. 2. Referring to FIG. 2, and FIG. 3a to FIG. 3e, in this embodiment, the another state of the composite functional film 10 is that the composite functional film 10 is not yet bonded to the display panel 20. Specifically, the composite functional film 10 further includes a release film 15 and a protective film 16. Wherein the release film 15 is located on a side of the adhesive layer 14 facing away from the heat dissipation layer 11, and the release film 15 is used to protect other film layers of the composite functional film 10 during storage or transportation. The protective film 16 is located on a side of the heat dissipation layer 11 facing away from the adhesive layer 14, and the protective film 16 provides effective protection to the heat dissipation layer 11, and prevents the heat dissipation layer 11 from oxidation, corrosion, and the like, caused by influences of external environment. Materials of the protective film 16 and the release film 15 both include at least one of polyethylene (PE), polyethylene terephthalate (PET), polymethyl methacrylate (PMMA), polycarbonate (PC), and polypropylene (PP). During practical applications of the composite functional film 10, that is, during the bonding of the composite functional film 10 to the display panel 20, it is necessary to remove the release film 15 and the protective film 16. Therefore, in order to facilitate the removal of the release film 15 and the protective film 16, a first hand-tearing part 151 and a second hand-tearing part 161 are provided on the release film 15 and the protective film 16, respectively.

In another aspect, the present application also provides a manufacturing method for the composite functional film 10. FIG. 4a to FIG. 4d are structural schematic views of each step of the manufacturing method of the composite functional film 10. The manufacturing method for the composite functional film 10 is further explained in combination with the drawings.

In this embodiment, the manufacturing method for the composite functional film 10 includes following steps:

S01: providing an adhesive layer 14, the adhesive layer 14 including a first region 141 and a second region 142 arranged around an outside of the first region 141, and forming a buffer layer 12 and a supporting layer 13 on the first region 141 and a second region 142, receptively; and S02: forming a heat dissipation layer 11 on the buffer layer 12 and the supporting layer 13, wherein the heat dissipation layer 11 includes a first part 111 and a second part 112, and the second part 112 is arranged around an outside of the first part 111; the first part 111 is disposed corresponding to the buffer layer 12, and the second part 112 is disposed corresponding to the supporting layer 13.

In this embodiment, the step S01 includes a sub-step S01-1, a sub-step S01-2, and a sub-step S01-3.

Figure 4A:
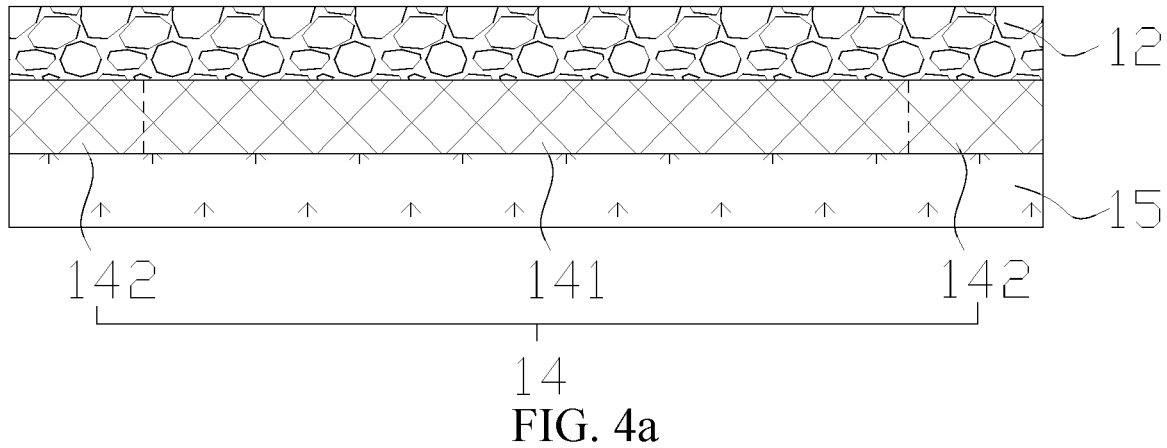
FIG. 4a to FIG. 4d are structural schematic views of each step of a manufacturing method of the composite functional film.
Figure 4B:
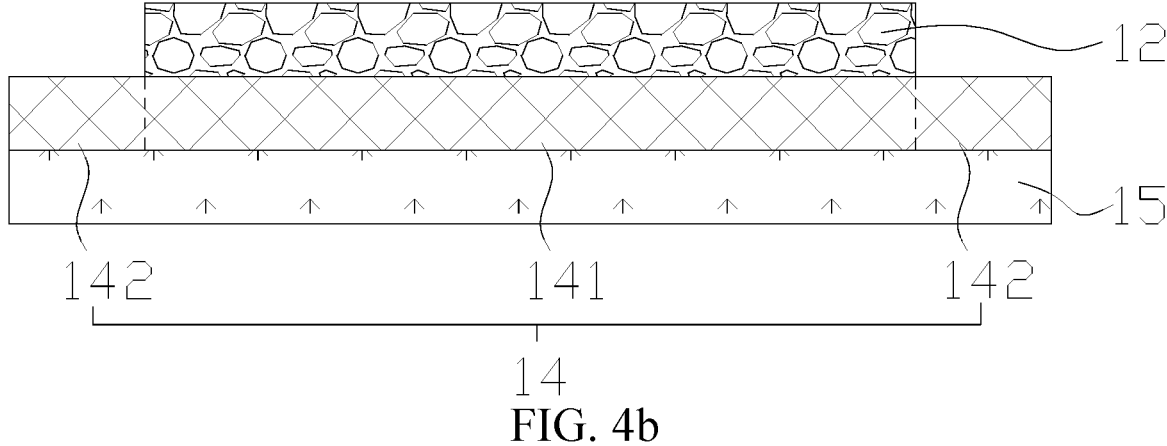
Figure 4C:
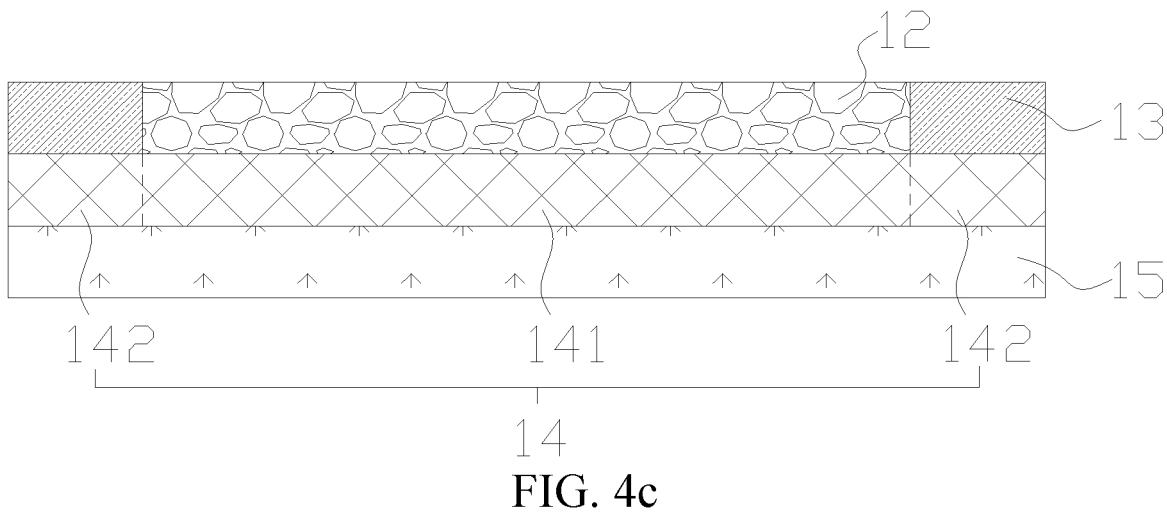

Please refer to FIG. 4a, S01-1 includes: providing an adhesive layer 14, the adhesive layer 14 including the first region 141 and the second region 142 arranged around an outside of the first region 141, and forming the buffer layer 12 on the first region 141 and a second region 142;

Please refer to FIG. 4b, S01-2 includes: die-cutting the buffer layer 12 using a cutting die with a round blade or a flat blade to remove the buffer layer 12 located on the second region 142, and keep the buffer layer 12 located on the first region 141;

Please refer to FIG. 4c, S01-3 includes: forming a supporting layer 13 on the second region 142.

Certainly, there is no limitation to specific implementations of each of the sub-steps in the step S01. For example, in other embodiments of the present application, the step S01 includes: a sub-step S01-1, a sub-step S01-2, and a sub-step S01-3, wherein the sub-step S01-1 is defined as: providing an adhesive layer 14, the adhesive layer 14 including the first region 141 and the second region 142 arranged around an outside of the first region 141; the sub-step S01-2 is defined as: providing a buffer layer 12, die-cutting the buffer layer 12 using a cutting die with a round blade or a flat blade to form a buffer layer 12 having a same size of the second region 142, and forming a supporting layer 13 on the second region 142.

In this embodiment, the step S02 includes a sub-step S02-1 and a sub-step S02-2.

Figure 4D:
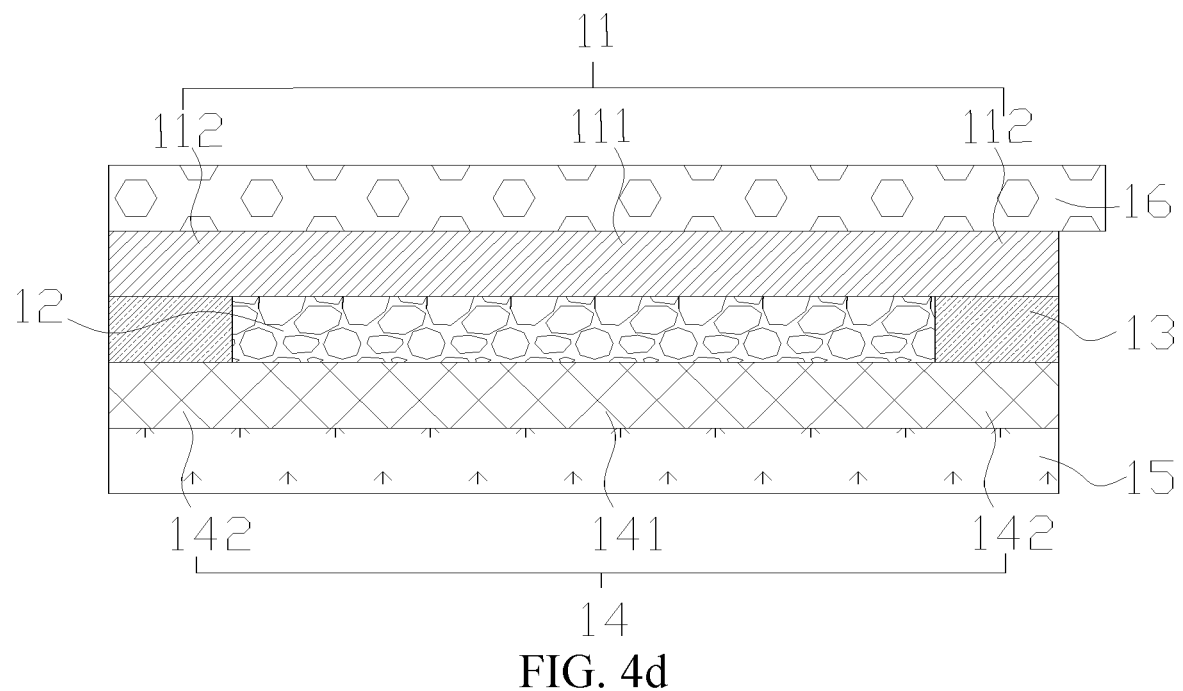

Please refer to FIG. 4d, the sub-step S02-1 includes: providing a heat dissipation layer 11, and arranging a protective film 16 on a side of the heat dissipation layer 11; the sub-step S02-2 includes: bonding another side of the heat dissipation layer 11 to the buffer layer 12 and the supporting layer 13 so as to form the heat dissipation layer 11 on the buffer layer 12 and the supporting layer 13, wherein the heat dissipation layer 11 includes a first part 111 and a second part 112, the second part 112 is arranged around an outside of the first part 111, the first part 111 is disposed corresponding to the buffer layer 12, and the second part 112 is disposed corresponding to the supporting layer 13.

Certainly, there is no limitation to the specific implementations of each of the sub-steps of the step S01. For example, in other embodiments of the present application, the step S02 includes a sub-step S02-1 and a sub-step S02-2. The sub-step S02-1 is defined as: forming a heat dissipation layer 11 on the buffer layer 12 and the supporting layer 13, wherein the heat dissipation layer 11 includes a first part 111 and a second part 112; the second part 112 is arranged around an outside of the first part 111, the first part 111 is disposed corresponding to the buffer layer 12, and the second part 112 is disposed corresponding to the supporting layer 13. The sub-step S02-2 is defined as forming a protective film 16 on the heat dissipation layer 11.

In still another aspect, the present application further provides a display device, and the display device includes: a display panel 20, a cover plate 30, and the composite functional film 10 as mentioned above.

Figure 5:
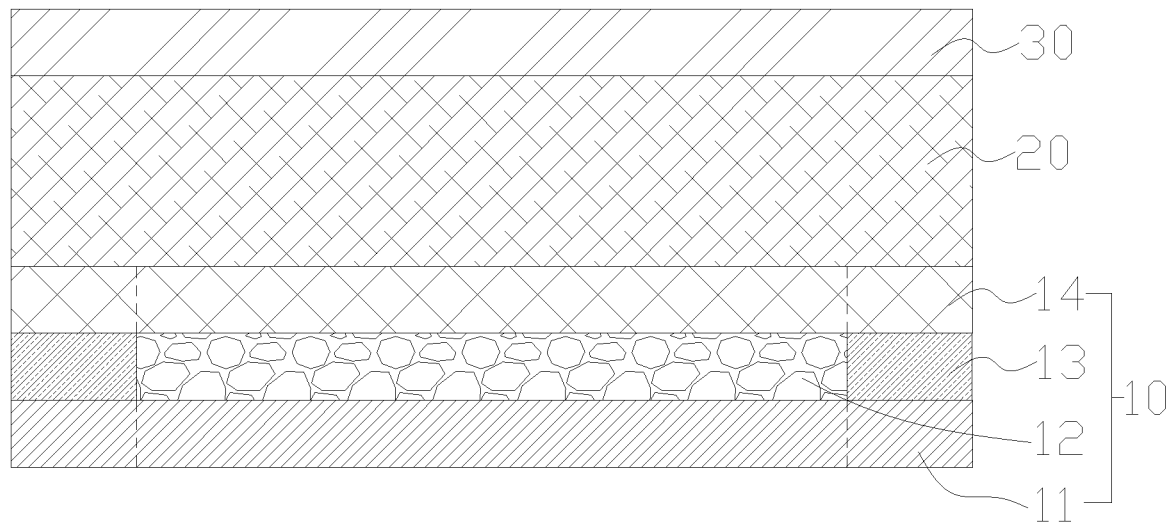
FIG. 5 is a structural schematic view of a display device provided by the embodiment 1 of the present application.

Please refer to FIG. 5, in this embodiment, the display device includes: a composite functional film 10, a display panel 20, and a cover plate 30 sequentially stacked. Wherein the display panel 20 is, for example, an OLED display panel. The display panel 20 includes a light-emitting side and a backlight side, wherein the light-emitting side refers to a side of the display panel 20 configured to display images, and the backlight side refers to an opposite side to the side of the display panel 20 configured to display images, and the display panel 20 can be a flexible OLED display panel or a rigid OLED display panel. The composite functional film 10 is disposed on the backlight side of the display panel 20. The cover plate 30 is disposed on the light-emitting side of the display panel 20. The cover plate 30 can be a planar cover plate or a curved cover plate, and a material of the cover plate 30 can be conventional glass, ultra-thin glass, polyimide, plastic, and etc.

Embodiment 2

Figure 6:
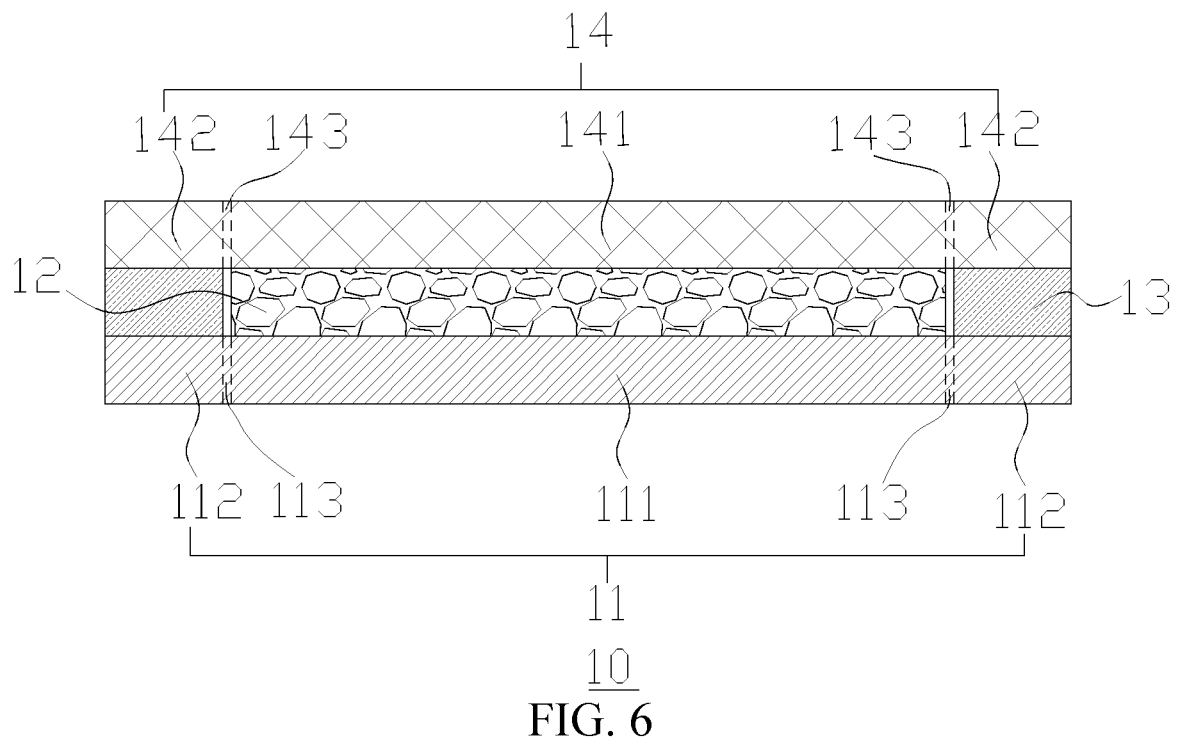
FIG. 6 is a structural schematic view of a composite functional film under a state provided by an embodiment 2 of the present application.

FIG. 6 is a structural schematic view of a composite functional film under a state provided by an embodiment 2 of the present application. As shown in FIG. 6, the embodiment 2 of the present application provides a composite functional film 10, and the composite functional film 10 includes multiple film layers and has functions of both heat dissipation and buffering. Specifically, the composite functional film 10 includes a heat dissipation layer 11, a buffer layer 12, and a supporting layer 13. Wherein the heat dissipation layer 11 includes a first part 111 and a second part 112 arranged around an outside of the first part 111; a buffer layer 12 disposed on a side of the heat dissipation layer 11 and disposed corresponding to the first part 111; a supporting layer 13 disposed on the side of the heat dissipation layer 11 and disposed corresponding to the second part 112; wherein the buffer layer 12 and the supporting layer 13 are disposed on a same side of the heat dissipation layer 11, and an elastic modulus of the supporting layer 13 is greater than an elastic modulus of the buffer layer 12.

A structure of the composite functional film 10 in the embodiment 2 is similar to the structure of the composite functional film 10 in the embodiment 1, and same descriptions will not be repeated in this embodiment.

Different from the embodiment 1, the heat dissipation layer 11 further includes a third part 113, and the third part 113 is arranged around the outside of the first part 111; the second part 112 is arranged around an outside of the third part 113, and the third part 113 adjoins the first part 111 and the second part 112, receptively; a gap region is defined between the buffer layer 12 and the supporting layer 13, and the gap region corresponds to the third part 113, wherein a thickness of the first part 111, a thickness of the second part 112, and a thickness of the third part 113 are equal to each other.

In this embodiment, the heat dissipation layer 11 further includes the third part 113, both the second part 112 and the third part 113 are in a square shape, and the third part 113 is located between the first part 111 and the second part 112. In addition, the gap region corresponding to the third part 113 is provided between the buffer layer 12 and the supporting layer 13, so that the buffer layer 12 and the supporting layer 13 are disposed at an interval, which makes it possible to reduce a mismatch due to stacking of the supporting layer 13 with the buffer layer 12, so as to solve a problem of an uneven surface occurring in the composite functional film 10, without affecting a supporting effect of the supporting layer 13.

In this embodiment, a width of the gap region ranges from 0.2 millimeters to 0.5 millimeters. Through defining the width of the gap region in a range of 0.2 millimeters to 0.5 millimeters in the present application, a probability of the uneven surface occurring in the composite functional film 10 can be further reduced.

In this embodiment, an orthographic projection of the adhesive layer 14 on the heat dissipation layer 11 covers the first part 111, the second part 112, and the third part 113. The adhesive layer 14 includes a first region 141, a second region 142, and a third region 143. The second region 142 is arranged around an outside of the third region 143, and the third region 143 is arranged around the outside of the first region 141; the first region 141 corresponds to the first part 111, the second region 142 corresponds to the second part 112, and the third region 143 corresponds to the third part 113.

In another aspect, the embodiment 2 of the present application also provides a manufacturing method for the composite functional film 10, and the manufacturing method for the composite functional film 10 includes following steps:

S01: providing an adhesive layer 14, the adhesive layer 14 including a first region 141 and a second region 142 arranged around an outside of the first region 141, and forming a buffer layer 12, and a supporting layer 13 on the first region 141 and a second region 142, receptively; and S02: forming a heat dissipation layer 11 on the buffer layer 12 and the supporting layer 13, wherein the heat dissipation layer 11 includes a first part 111 and a second part 112, the second part 112 is arranged around an outside of the first part 111, the first part 111 is disposed corresponding to the buffer layer 12, and the second part 112 is disposed corresponding to the supporting layer 13.

The manufacturing method for the composite functional film 10 in the embodiment 2 is similar to the manufacturing method for the composite functional film 10 in the embodiment 1, and same descriptions will not be repeated in this embodiment.

Different from the embodiment 1, in the step S01, the adhesive layer 14 further includes a third region 143, and the third region 143 is arranged around an outside of the first region 141; the second region 142 is arranged around an outside of the third region 143, and the third region 143 is not disposed with the buffer layer 12 and the supporting layer 13 thereon, so as to form a gap region between the buffer layer 12 and the supporting layer 13; in the step S02, the heat dissipation layer 11 further includes a third part 113, and the third part 113 is arranged around an outside of the first part 111; the second part 112 is arranged around an outside of the third part 113, and the third part 113 is disposed corresponding to both the gap region and the third region 143.

In still another aspect, the present application further provides a display device, the display device includes: a display panel 20, a cover plate 30, and the composite functional film 10 as mentioned above. A structure of the display device provided in the embodiment 2 is similar to the structure of the display device in the embodiment 1, and same descriptions will not be repeated in this embodiment.

Embodiment 3

Figure 7:
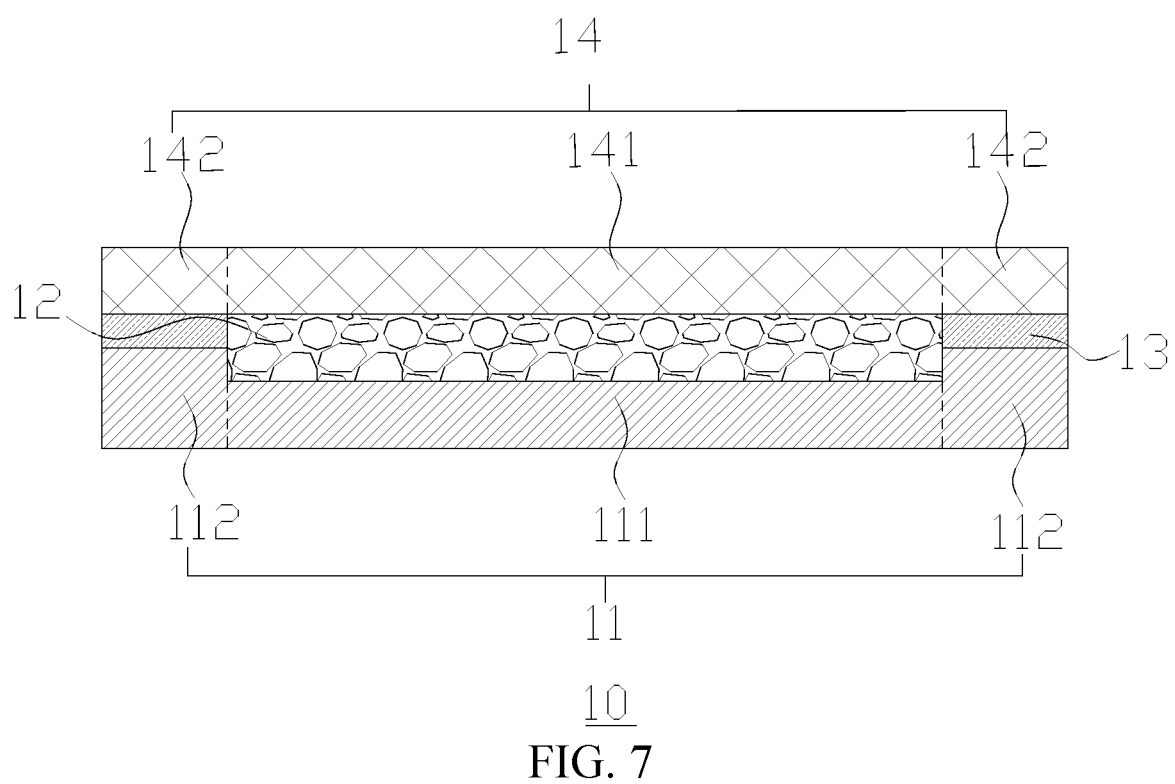
FIG. 7 is a structural schematic view of a composite functional film under a state provided by an embodiment 3 of the present application.

FIG. 7 is a structural schematic view of a composite functional film under a state provided by an embodiment 3 of the present application. As shown in FIG. 7, and the embodiment 3 of the present application provides a composite functional film 10, the composite functional film 10 includes multiple film layers and has functions of heat dissipation and buffering. Specifically, the composite functional film 10 includes a heat dissipation layer 11, a buffer layer 12, and a supporting layer 13. Wherein the heat dissipation layer 11 includes a first part 111 and a second part 112, and the second part 112 is arranged around an outside of the first part 111; a buffer layer 12 disposed on a side of the heat dissipation layer 11 and disposed corresponding to the first part 111; a supporting layer 13 disposed on the side of the heat dissipation layer 11 and disposed corresponding to the second part 112; and the buffer layer 12 and the supporting layer 13 are disposed on a same side of the heat dissipation layer 11, and an elastic modulus of the supporting layer 13 is greater than an elastic modulus of the buffer layer 12.

A structure of the composite functional film 10 in the embodiment 3 is similar to the structure of the composite functional film 10 in the embodiment 1, and same descriptions will not be repeated in this embodiment.

Different from embodiment 1, a thickness of the first part 111 is less than a thickness of the second part 112, and a thickness of the buffer layer 12 is greater than a thickness of the supporting layer 13. In addition, as the thickness of the first part 111 is less than the thickness of the second part 112, and the thickness of the buffer layer 12 is greater than the thickness of the supporting layer 13, a distance from the second part 112 of the heat dissipation layer 11 to the second region 142 of the adhesive layer 14 becomes smaller, and correspondingly, a gap between the second part 112 of the heat dissipation layer 11 and an edge region of the display panel 20 becomes smaller, so as to further enhance the heat dissipation performance of the heat dissipation layer 11. Moreover, compared with the embodiment 1, the thickness of the second part 112 of the heat dissipation layer 11 is greater, which enhance anti-curling performance of the second part 112 of the heat dissipation layer 11, and further reduce the probability of curling occurring in the composite functional film 10.

In another aspect, the embodiment 3 of the present application also provides a manufacturing method for the composite functional film 10, the manufacturing method for the composite functional film 10 includes following steps:

S01: providing an adhesive layer 14, the adhesive layer 14 including a first region 141 and a second region 142 arranged around an outside of the first region 141, and forming a buffer layer 12 and a supporting layer 13 on the first region 141 and a second region 142, receptively; and S02: forming a heat dissipation layer 11 on the buffer layer 12 and the supporting layer 13, wherein the heat dissipation layer 11 includes a first part 111 and a second part 112, and the second part 112 is arranged around an outside of the first part 111; the first part 111 is disposed corresponding to the buffer layer 12, and the second part 112 is disposed corresponding to the supporting layer 13.

The manufacturing method for the composite functional film 10 in the embodiment 3 is similar to the manufacturing method for the composite functional film 10 in the embodiment 1, and same descriptions will not be repeated in this embodiment.

In still another aspect, the present application further provides a display device, and the display device includes: a display panel 20, a cover plate 30, and the composite functional film 10 as mentioned above. A structure of the display device provided in the embodiment 3 is similar to the structure of the display device in the embodiment 1, and same descriptions will not be repeated in this embodiment.

Different from embodiment 1, as the thickness of the second part 112 of the heat dissipation layer 11 is greater compared with the embodiment 1, the gap between the second part 112 of the heat dissipation layer 11 and an edge region of the cover plate 30 is decreased, so as to provide a stronger electrostatic shielding performance to the composite functional film 10. In particular, under a condition that the cover plate 30 in the display device is a curved cover plate 30, antistatic ability of a curved display device can be greatly enhanced.

Embodiment 4

Figure 8:
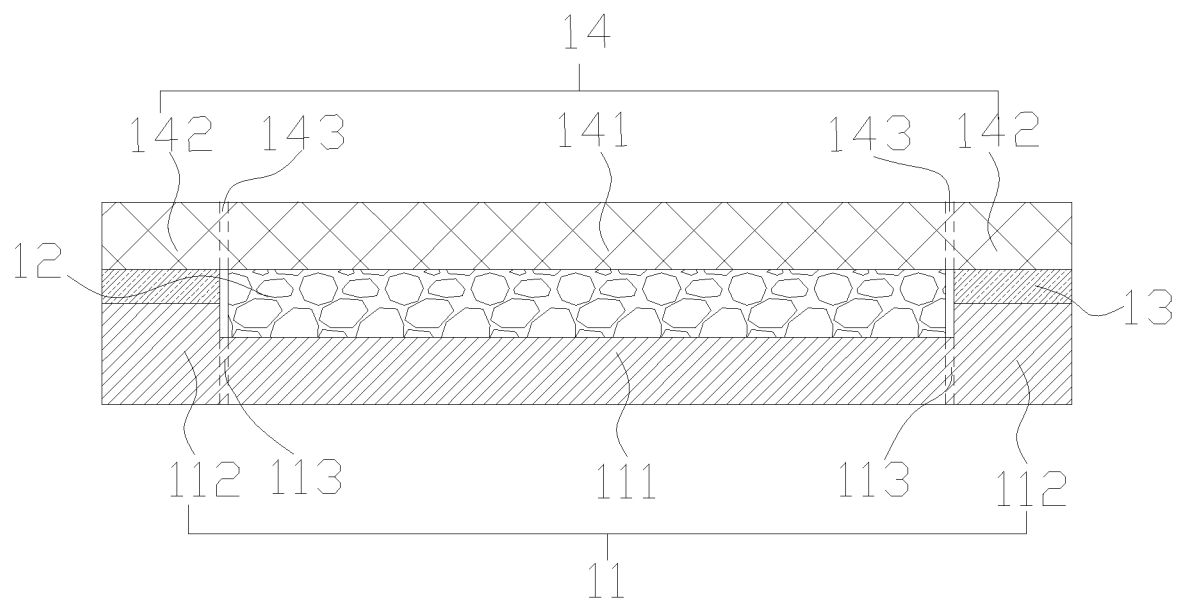
FIG. 8 is a structural schematic view of a composite functional film under a state provided by an embodiment 4 of the present application.

FIG. 8 is a structural schematic view of a composite functional film under a state provided by an embodiment 4 of the present application. As shown in FIG. 8, and embodiment 4 of the present application provides a composite functional film 10, the composite functional film 10 includes multiple film layers and has functions of heat dissipation and buffering. Specifically, the composite functional film 10 includes a heat dissipation layer 11, a buffer layer 12, and a supporting layer 13. Wherein the heat dissipation layer 11 includes a first part 111 and a second part 112, and the second part 112 is arranged around an outside of the first part 111; a buffer layer 12 disposed on a side of the heat dissipation layer 11 and disposed corresponding to the first part 111; a supporting layer 13 disposed on the side of the heat dissipation layer 11 and disposed corresponding to the second part 112; and the buffer layer 12 and the supporting layer 13 are disposed on a same side of the heat dissipation layer 11, and an elastic modulus of the supporting layer 13 is greater than an elastic modulus of the buffer layer 12.

A structure of the composite functional film 10 in the embodiment 4 is similar to the structure of the composite functional film 10 in the embodiment 3, and same descriptions will not be repeated in this embodiment.

Different from the embodiment 3, the heat dissipation layer 11 further includes a third part 113, and the third part 113 is arranged around the outside of the first part 111; the second part 112 is arranged around an outside of the third part 113, and the third part 113 adjoins the first part 111 and the second part 112, receptively; a gap region is defined between the buffer layer 12 and the supporting layer 13, and the gap region corresponds to the third part 113, wherein a thickness of the first part 111 is equal to a thickness of the third part 113.

In this embodiment, the heat dissipation layer 11 further includes the third part 113, both the second part 112 and the third part 113 are in a square shape, and the third part 113 is located between the first part 111 and the second part 112. In addition, the gap region corresponding to the third part 113 is provided between the buffer layer 12 and the supporting layer 13, so that the buffer layer 12 and the supporting layer 13 are disposed at an interval, which makes it possible to reduce a mismatch due to a stacking of the supporting layer 13 with the buffer layer 12, so as to solve a problem of an uneven surface occurring in the composite functional film 10, without affecting a supporting effect of the supporting layer 13.

In this embodiment, an orthographic projection of the adhesive layer 14 on the heat dissipation layer 11 covers the first part 111, the second part 112, and the third part 113. The adhesive layer 14 includes a first region 141, a second region 142, and a third region 143. The second region 142 is arranged around an outside of the third region 143, and the third region 143 is arranged around the outside of the first region 141; the first region 141 corresponds to the first part 111, the second region 142 corresponds to the second part 112, and the third region 143 corresponds to the third part 113.

In another aspect, the embodiment 4 of the present application also provides a manufacturing method for the composite functional film 10, the manufacturing method for the composite functional film 10 includes following steps:

S01: providing an adhesive layer 14, the adhesive layer 14 including a first region 141 and a second region 142 arranged around an outside of the first region 141, and forming a buffer layer 12, and a supporting layer 13 on the first region 141 and a second region 142, receptively; and S02: forming a heat dissipation layer 11 on the buffer layer 12 and the supporting layer 13, wherein the heat dissipation layer 11 includes a first part 111 and a second part 112, and the second part 112 is arranged around an outside of the first part 111; the first part 111 is disposed corresponding to the buffer layer 12, and the second part 112 is disposed corresponding to the supporting layer 13.

The manufacturing method for the composite functional film 10 in the embodiment 4 is similar to the manufacturing method for the composite functional film 10 in the embodiment 3, and same descriptions will not be repeated in this embodiment.

Different from embodiment 1, in the step S01, the adhesive layer 14 further includes a third region 143, and the third region 143 is arranged around the outside of the first region 141; the second region 142 is arranged around an outside of the third region 143, and the third region 143 is not disposed with the buffer layer 12 and the supporting layer 13 thereon, so as to form a gap region between the buffer layer 12 and the supporting layer 13; in the step S02, the heat dissipation layer 11 further includes a third part 113, and the third part 113 is arranged around an outside of the first part 111; the second part 112 is arranged around an outside of the third part 113, and the third part 113 is disposed corresponding to both the gap region and the third region 143.

In still another aspect, the present application further provides a display device, and the display device includes: a display panel 20, a cover plate 30, and the composite functional film 10 as mentioned above. A structure of the display device provided in the embodiment 4 is similar to the structure of the display device in the embodiment 3, and same descriptions will not be repeated in this embodiment.

Embodiment 5

Figure 9:
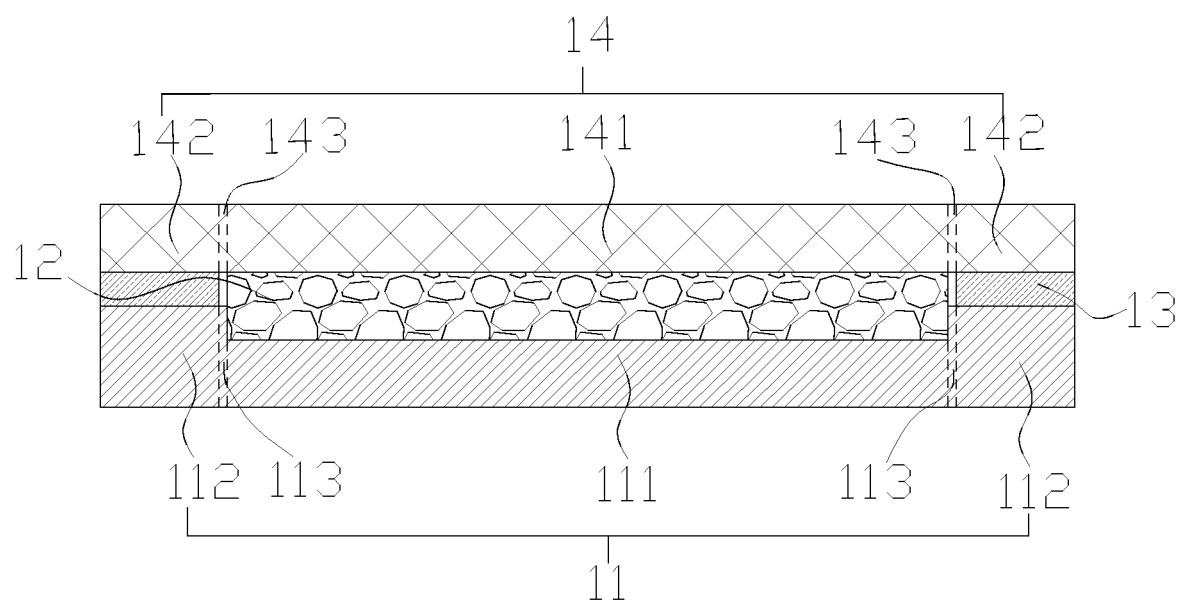
FIG. 9 is a structural schematic view of a composite functional film under a state provided by an embodiment 5 of the present application.

FIG. 9 is a structural schematic view of a composite functional film under a state provided by an embodiment 5 of the present application. As shown in FIG. 9, and the embodiment 5 of the present application provides a composite functional film 10, and the composite functional film 10 includes multiple film layers, and has functions of heat dissipation and buffering. Specifically, the composite functional film 10 includes a heat dissipation layer 11, a buffer layer 12, and a supporting layer 13. Wherein the heat dissipation layer 11 includes a first part 111 and a second part 112, the second part 112 is arranged around an outside of the first part 111; a buffer layer 12 disposed on a side of the heat dissipation layer 11 and disposed corresponding to the first part 111; a supporting layer 13 disposed on the side of the heat dissipation layer 11 and disposed corresponding to the second part 112; and the buffer layer 12 and the supporting layer 13 are disposed on a same side of the heat dissipation layer 11, and an elastic modulus of the supporting layer 13 is greater than an elastic modulus of the buffer layer 12.

A structure of the composite functional film 10 in the embodiment 5 is similar to the structure of the composite functional film 10 in the embodiment 4, and same descriptions will not be repeated in this embodiment.

Different from embodiment 4, a thickness of the second part 112 is equal to a thickness of the third part 113, and the composite functional film 10 has a stronger heat dissipation effect compared with the embodiment 4.

In another aspect, the embodiment 5 of the present application also provides a manufacturing method for the composite functional film 10, the manufacturing method for the composite functional film 10 includes following steps:

S01: providing an adhesive layer 14, the adhesive layer 14 including a first region 141 and a second region 142 arranged around an outside of the first region 141, and forming a buffer layer 12, and a supporting layer 13 on the first region 141 and a second region 142, receptively; and S02: forming a heat dissipation layer 11 on the buffer layer 12 and the supporting layer 13, wherein the heat dissipation layer 11 includes a first part 111 and a second part 112, and the second part 112 is arranged around an outside of the first part 111; the first part 111 is disposed corresponding to the buffer layer 12, and the second part 112 is disposed corresponding to the supporting layer 13.

The manufacturing method for the composite functional film 10 in the embodiment 5 is similar to the manufacturing method for the composite functional film 10 in the embodiment 4, and same descriptions will not be repeated in this embodiment.

In still another aspect, the present application further provides a display device, the display device includes: a display panel 20, a cover plate 30, and the composite functional film 10 as mentioned above. A structure of the display device provided in the embodiment 5 is similar to the structure of the display device in the embodiment 4, and same descriptions will not be repeated in this embodiment. Different from embodiment 4, a thickness of the second part 112 of the heat dissipation layer 11 is equal to a thickness of the third part 113, the composite functional film 10 has a stronger electrostatic shielding performance, and the display device has stronger antistatic ability, compared with that of embodiment 4.

In conclusion, the present application provides a composite functional film, a manufacturing method for same, and a display device are provided by the present application. The composite functional film includes a heat dissipation layer including a first part and a second part arranged around an outside of the first part; a buffer layer disposed on a side of the heat dissipation layer and disposed corresponding to the first part; a supporting layer disposed on the side of the heat dissipation layer and disposed corresponding to the second part; and the buffer layer and the supporting layer are disposed on a same side of the heat dissipation layer, and an elastic modulus of the supporting layer is greater than an elastic modulus of the buffer layer. In the present application, the supporting layer having a greater elastic modulus is disposed corresponding to the second part of the heat dissipation layer, so as to improve a support strength of an edge position of the heat dissipation layer in the composite functional film, which lowers a probability of curling during a die-cutting process of the heat dissipation layer, ensures identification accuracy of AOI devices, increases a bonding yield between the composite functional films and display panels, and ensures display quality.

The composite functional film, manufacturing method for same, and display device provided by the present application are described in detail. In this paper, specific examples are applied to illustrate the principle and embodiment of the present application. The description of the above embodiments is only used to help understand the method and core idea of the application. At the same time, for those skilled in the art, according to the thought of the present disclosure, there will be changes in the specific embodiments and application scope. In conclusion, the content of the specification should not be understood as the limitation of the application.

What is claimed is:

1. A composite functional film, wherein the composite functional film comprises:
   a heat dissipation layer comprising a first part and a second part, wherein the second part is arranged around an outside of the first part;
   a buffer layer disposed on a side of the heat dissipation layer, and disposed corresponding to the first part; and
   a supporting layer disposed on the side of the heat dissipation layer, and disposed corresponding to the second part;
   wherein the buffer layer and the supporting layer are located on a same side of the heat dissipation layer, and an elastic modulus of the supporting layer is greater than an elastic modulus of the buffer layer; and a thickness of the first part is less than a thickness of the second part, and a thickness of the buffer layer is greater than a thickness of the supporting layer.

2. The composite functional film according to claim 1, wherein the heat dissipation layer further comprises a third part, and the third part is arranged around the outside of the first part; the second part is arranged around an outside of the third part, and the third part adjoins the first part and the second part, receptively; a gap region is defined between the buffer layer and the supporting layer, and the gap region corresponds to the third part, wherein the thickness of the first part is equal to a thickness of the third part.

3. The composite functional film according to claim 2, wherein a width of the gap region ranges from 0.2 millimeters to 0.5 millimeters.

4. The composite functional film according to claim 1, wherein the heat dissipation layer further comprises a third part, and the third part is arranged around the outside of the first part; the second part is arranged around an outside of the third part, and the third part adjoins the first part and the second part, receptively; a gap region is defined between the buffer layer and the supporting layer, and the gap region corresponds to the third part, wherein the thickness of the second part is equal to a thickness of the third part.

5. The composite functional film according to claim 4, wherein a width of the gap region ranges from 0.2 millimeters to 0.5 millimeters.

6. The composite functional film according to claim 1, wherein the composite functional film further comprises an adhesive layer, and the adhesive layer is disposed on a side of the buffer layer facing away from the heat dissipation layer, and an orthographic projection of the adhesive layer on the heat dissipation layer covers the first part and the second part.

7. A manufacturing method for a composite functional film, comprising following steps:
provanding an adhesive layer, the adhesive layer comprising a first region and a second region arranged around an outside of the first region, and forming a buffer layer and a supporting layer on the first region and the second region, receptively; and
forming a heat dissipation layer on the buffer layer and the supporting layer, wherein the heat dissipation layer comprises a first part and a second part, and the second part is arranged around an outside of the first part; the first part is disposed corresponding to the buffer layer, and the second part is disposed corresponding to the supporting layer; wherein the buffer layer and the supporting layer are located on a same side of the heat dissipation layer, and an elastic modulus of the supporting layer is greater than an elastic modulus of the buffer layer; and a thickness of the first part is less than a thickness of the second part, and a thickness of the buffer layer is greater than a thickness of the supporting layer.

8. The manufacturing method for the composite functional film according to claim 7, wherein the adhesive layer is formed on a release film, and a protective film is disposed on a side of the heat dissipation layer facing away from the buffer layer and the supporting layer.

9. A display device, comprising a display panel, a cover glass, and a composite functional film, wherein the display panel has a light-emitting side and a backlight side; the composite functional film is disposed on the backlight side of the display panel, the cover glass is disposed on the light-emitting side of the display panel, and the composite functional film comprises:
a heat dissipation layer comprising a first part and a second part, wherein the second part is arranged around an outside of the first part;
a buffer layer disposed on a side of the heat dissipation layer, and disposed corresponding to the first part; and
a supporting layer disposed on the side of the heat dissipation layer, and disposed corresponding to the second part;
wherein the buffer layer and the supporting layer are located on a same side of the heat dissipation layer, and an elastic modulus of the supporting layer is greater than an elastic modulus of the buffer layer; and a thickness of the first part is less than a thickness of the second part, and a thickness of the buffer layer is greater than a thickness of the supporting layer.

10. The display device according to claim 9, wherein the heat dissipation layer further comprises a third part, and the third part is arranged around the outside of the first part; the second part is arranged around an outside of the third part, and the third part adjoins the first part and the second part, receptively; a gap region is defined between the buffer layer and the supporting layer, and the gap region corresponds to the third part, wherein the thickness of the first part is equal to a thickness of the third part.

11. The display device according to claim 9, wherein the heat dissipation layer further comprises a third part, and the third part is arranged around the outside of the first part; the second part is arranged around an outside of the third part, and the third part adjoins the first part and the second part, receptively; a gap region is defined between the buffer layer and the supporting layer, and the gap region corresponds to the third part, wherein the thickness of the second part is equal to a thickness of the third part.

12. The display device according to claim 9, wherein the composite functional film further comprises an adhesive layer, and the adhesive layer is disposed on a side of the buffer layer facing away from the heat dissipation layer, and an orthographic projection of the adhesive layer on the heat dissipation layer covers the first part and the second part.

13. The composite functional film according to claim 1, wherein the composite functional film further comprises an adhesive layer, and the adhesive layer is disposed on a side of the buffer layer facing away from the heat dissipation layer; and the adhesive layer comprises a first region and a second region, the second region is arranged around an outside of the first region, the first region corresponds to the first part, and the second region corresponds to the second part; and
a distance between the second part and the second region is less than a distance between the first part and the first region.

14. The composite functional film according to claim 1, wherein the heat dissipation layer further comprises a third part, and the third part is arranged around the outside of the first part; the second part is arranged around an outside of the third part, and the third part adjoins the first part and the second part, receptively; a gap region is defined between the buffer layer and the supporting layer, and the gap region corresponds to the third part, wherein the thickness of the first part is equal to a thickness of the third part; and
wherein both the second part and the third part are in a square shape, and the third part is located between the first part and the second part.

15. The composite functional film according to claim 1, wherein the heat dissipation layer further comprises a third part, and the third part is arranged around the outside of the first part; the second part is arranged around an outside of the third part, and the third part adjoins the first part and the second part, receptively; a first gap corresponding to the third part is defined between the buffer layer and the supporting layer, a second gap communicated with the first gap is defined between the buffer layer and the second part; and wherein the thickness of the first part is equal to a thickness of the third part.

16. The composite functional film according to claim 1, wherein a material of the supporting layer comprises at least one of polyethylene terephthalate (PET), acrylonitrile butadiene styrene copolymer (ABS), polyimide (PI), polyethylene (PE), polymethyl methacrylate (PMMA), polycarbonate (PC), and polypropylene (PP).

17. The display device according to claim 9, wherein the composite functional film further comprises an adhesive layer, and the adhesive layer is disposed on a side of the buffer layer facing away from the heat dissipation layer; and the adhesive layer comprises a first region and a second region, the second region is arranged around an outside of the first region, the first region corresponds to the first part, and the second region corresponds to the second part; and
a distance between the second part and the second region is less than a distance between the first part and the first region.

18. The display device according to claim 9, wherein the heat dissipation layer further comprises a third part, and the third part is arranged around the outside of the first part; the second part is arranged around an outside of the third part, and the third part adjoins the first part and the second part, receptively; a gap region is defined between the buffer layer and the supporting layer, and the gap region corresponds to the third part, wherein the thickness of the first part is equal to a thickness of the third part; and wherein both the second part and the third part are in a square shape, and the third part is located between the first part and the second part.

19. The display device according to claim 9, wherein the heat dissipation layer further comprises a third part, and the third part is arranged around the outside of the first part; the second part is arranged around an outside of the third part, and the third part adjoins the first part and the second part, receptively; a first gap corresponding to the third part is defined between the buffer layer and the supporting layer, a second gap communicated with the first gap is defined between the buffer layer and the second part; and wherein the thickness of the first part is equal to a thickness of the third part.

20. The display device according to claim 9, wherein a material of the supporting layer comprises at least one of polyethylene terephthalate (PET), acrylonitrile butadiene styrene copolymer (ABS), polyimide (PI), polyethylene (PE), polymethyl methacrylate (PMMA), polycarbonate (PC), and polypropylene (PP).

\* \* \* \* \*